United States Patent [19]

Bruckenstein et al.

[11] 3,918,005

[45] Nov. 4, 1975

[54] OPERATIONAL AMPLIFIER CIRCUITRY WITH AUTOMATIC SELF-BIASING FOR ENHANCED VOLTAGE COMPLIANCE

[75] Inventors: Stanley Bruckenstein, Amherst, N.Y.; Barry Miller, Murray Hill, N.J.

[73] Assignee: Bell Telephone Laboratories, Inc., Murray Hill, N.J.

[22] Filed: July 24, 1974

[21] Appl. No.: 491,344

[52] U.S. Cl. .................... 330/99; 330/75

[51] Int. Cl.$^2$ .................... H03F 1/24

[58] Field of Search .................... 330/103, 99, 69

[56] References Cited

UNITED STATES PATENTS

| | | | |
|---|---|---|---|
| 3,088,026 | 4/1963 | Burwen | 330/103 X |
| 3,737,798 | 6/1973 | Faraguet et al. | 330/99 X |
| 3,801,924 | 4/1974 | Mueller et al. | 330/103 X |

*Primary Examiner*—Nathan Kaufman
*Attorney, Agent, or Firm*—C. S. Phelan

[57] ABSTRACT

In a circuit configuration of two tandemly connected operational amplifiers either controlled current or controlled voltage is provided at a load impedance connected across the inverting input and the output of the second operational amplifier. The signal being controlled is independent of the value of the load impedance. The voltage compliance across the load impedance is enhanced by the addition of a pair of feedback loops connected around the tandemly coupled operational amplifiers.

7 Claims, 3 Drawing Figures

OPERATIONAL AMPLIFIER CIRCUITRY WITH AUTOMATIC SELF-BIASING FOR ENHANCED VOLTAGE COMPLIANCE

BACKGROUND OF THE INVENTION

1. Field of the Invention

This invention relates to control circuitry and, in particular, to control circuitry utilizing operational amplifiers to provide a controlled signal level at a load impedance.

2. Description of the Prior Art

In numerous control system applications either the current through a load impedance or the voltage at some point in the impedance must be accurately controlled regardless of the value that the load impedance takes on over some predetermined range of values. For example, in electrochemical cells, the rate of reaction is controlled by the rate of current flow maintained in a solution between an auxiliary electrode and a working electrode. It is often desirable to control this rate at a preset value in spite of changes in the electrode potentials and the components of impedance in the cell. In the case of electrodeposition, a common application, a workpiece to be plated is attached to the working electrode. Too fast a reaction gives rise to the production of other chemicals besides the desired ones and these chemicals adversely affect the uniformity of the plated material. In electrochemical copper plating, for instance, too high a rate of reduction causes hydrogen to be released from the aqueous solution of copper sulphate along with the copper. The hydrogen so released collects on the workpiece being plated and causes the copper to loosely adhere thereto. Subsequent handling of the plated piece could result in flakes of copper being removed from the piece. In contrast, too low a rate of reaction may be uneconomic or even cause nodular-type deposits which are coarse and rough and create undesired variations in surface smoothness.

Another factor, which can operate to alter the amount of impedance between the working electrode and the auxiliary electrode and, therefore, affect the control of the reaction in an electrochemical cell, is the insertion of a porous membrane between the electrodes to prevent anode products from reaching the cathode. In order to maintain the proper current flow as the impedance increases, the voltage across the two electrodes must be increased proportionately. However, at some point the voltage swing available from a source becomes limiting and the uniform rate of current flow can no longer be provided without substituting a higher voltage control loop along with its associated higher voltage power supply circuitry.

Accordingly, it is one object of the present invention to increase the available voltage swing or compliance across the load impedance without having to increase the power handling capability of the control loop amplifiers.

Another object is to have all the control loop amplifiers powered by the same voltage level bipolar power supply.

A further object of the present invention is to reduce the effects on the electrical parameter being controlled, whether it be current or voltage, caused by variations in load impedance.

Still an additional object is to enable existing control loop circuitry to be readily modified with inexpensive components to provide the increased voltage compliance capability.

SUMMARY OF THE INVENTION

The foregoing and other objects of the invention are realized in an illustrative embodiment wherein an operational amplifier, having an inverting and a noninverting input and an output, has a load impedance connected between the output and the inverting input. A controlled signal level is maintained at the load impedance when the operational amplifier is driven by a signal source supplying a predetermined control current signal. This signal is applied to the inverting input of the operational amplifier. Enhanced voltage compliance at the load impedance is produced by feeding back an inverted portion of the output signal from the operational amplifier to its noninverting input and by feeding back a portion of the operational amplifier output signal to the input of the control current signal source. The resulting enhancement is by nearly a factor of two.

Accordingly, it is one feature of the present invention that the voltage compliance across a load impedance is enhanced without increasing the power handling capability of the control circuit components.

Another feature is that the enhanced voltage compliance is obtained through the addition of low power, inexpensive circuit components in a feedback arrangement.

It is a further feature that all of the operational amplifiers can be powered from a single bipolar power supply having the same voltage as in an unenhanced voltage compliance circuit configuration.

BRIEF DESCRIPTION OF THE DRAWINGS

The aforementioned features and objects of the invention as well as other features and objects will be better understood upon a consideration of the following detailed description and the appended claims in connection with the attached drawings in which:

DETAILED DESCRIPTION

Before embarking on a detailed description of the enhanced voltage compliance operation of the operational amplifier circuitry, it should be noted that an operational amplifier is a high-gain D.C. coupled amplifier having either a differential or single-ended input with the output usually being single-ended with respect to a reference ground potential. In a differential input amplifier signals applied to a noninverting terminal marked (+) are amplified by a positive gain, whereas signals applied to an inverting terminal marked (−) are amplified by, in effect, a negative gain. Other characteristics of an operational amplifier, as noted in Operational Amplifiers, Design and Applications, by J. G. Graeme et al., McGraw-Hill Book Company, 1971 at pages 427 through 429, which greatly simplify the analysis of amplifier operation, are that very little or no current flows into the amplifier inputs, that the gain and input impedance are extremely high - approaching infinity, and that the output impedance is extremely low

- approaching zero. As the gain of the operational amplifier becomes arbitrarily large, the summing point voltage which comprises the combination of signals appearing on an ungrounded input approaches zero and, consequently, a virtual short circuit exists between the inverting (−) and noninverting (+) inputs. In addition to the foregoing, it will be helpful to note that a dual subscript notation, such as $V_{x,y}$, will be utilized to refer to the various signals encountered in the circuit description. The first subscript, $x$, in this dual notation refers to an operational amplifier terminal whereas the second subscript, $y$, refers to the particular operational amplifier at which that signal appears. Keeping this background information in mind throughout the ensuing discussion, wherein idealized operational amplifier characteristics are assumed, will greatly simplify the circuit description and analysis.

Figure 1:
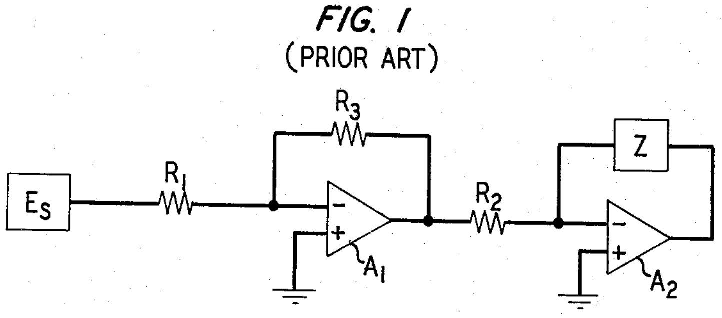
FIG. 1 (PRIOR ART)
FIG. 1 represents a prior art circuit which provides a controlled current through a load impedance.

The prior art circuitry illustrated in FIG. 1 provides a controlled current to a load impedance Z which has one end maintained at a reference potential of virtual ground. The current delivered to the load impedance Z is independent of the value of the impedance over a specified range dependent only upon the current and voltage capabilities of operational amplifiers $A_1$ and $A_2$. To provide this controlled current through the load impedance Z, operational amplifier $A_1$, which has a differential input comprised of inverting (−) and noninverting (+) inputs, is driven by a source of control voltage signals $E_s$. Source $E_s$ is serially coupled to the inverting (−) input of $A_1$ through a resistor $R_1$. The noninverting (+) input of $A_1$ is maintained at a reference ground potential.

A portion of the output from operational amplifier $A_1$ is fed back through a resistor $R_3$ to its inverting (−) input. The gain of operational amplifier $A_1$ is fixed by resistors $R_1$ and $R_3$. Consequently, the output of operational amplifier $A_1$ can be expressed as $$V_{0,1} = \frac{-R_3}{R_1} E_s . \quad (1)$$

A resistor $R_2$ connects the output of operational amplifier $A_1$ to the inverting (−) input of operational amplifier $A_2$. The noninverting (+) input of operational amplifier $A_2$ is maintained at the same reference ground potential as the noninverting (+) input of operational amplifier $A_1$. Connected across the output of operational amplifier $A_2$ and its inverting (−) input is the load impedance Z.

Because no current flows into the inverting (−) input of an operational amplifier, the current flowing through resistor $R_2$ is approximately the same as the current delivered to the load impedance Z. This current can be expressed as $$I = \frac{E_s(R_3/R_1)}{R_2} . \quad (2)$$

Although the current through the load impedance Z is independent of its value, it should be noted that the voltage compliance, which is defined as the maximum available voltage swing across the load impedance, is limited. This limitation results from the operational amplifier characteristic of a virtual short circuit existing between the inverting (−) and noninverting (+) inputs causing one side of load impedance Z to be held fixed at the reference ground potential. For the prior art circuit illustrated in FIG. 1 the voltage compliance may be expressed as $$V_c = V_{0,2} \quad (3)$$

Figure 2:
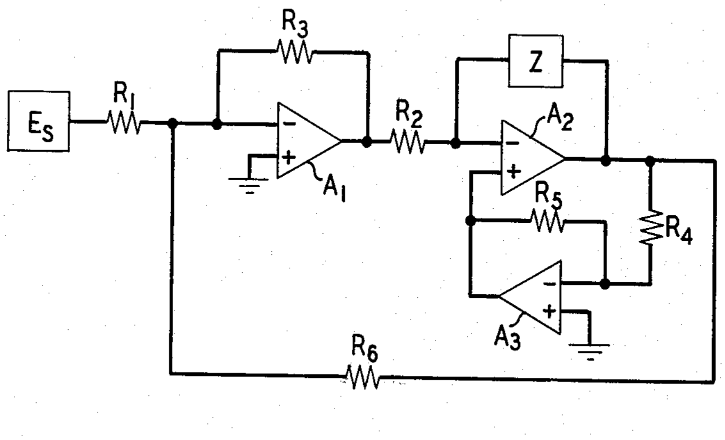
FIG. 2 represents a circuit for providing a controlled current through a load impedance while enhancing the voltage compliance across the load.

Enhanced voltage compliance across the load impedance Z is achieved in the circuit illustrated in FIG. 2 by ungrounding the noninverting (+) input of operational amplifier $A_2$ and by adding a pair of feedback loops to the prior art circuitry. One of the feedback loops couples an inverted portion of the output signal from operational amplifier $A_2$ back to its noninverting (+) input. The other feedback loop couples a portion of the output signal from operational amplifier $A_2$ back to the inverting (−) input of operational amplifier $A_1$.

In implementing the first feedback loop a portion of the output signal from operational amplifier $A_2$ is coupled through a resistor $R_4$ to the inverting (−) input of an operational amplifier $A_3$ which provides the signal inversion function. Although other methods of achieving signal inversion might be employed, such as the use of passive component phase shift networks, convenience of design suggests the use of a low power, inexpensive operational amplifier. The noninverting (+) input of operational amplifier $A_3$ is maintained at the reference ground potential. A resistor $R_5$ is connected between the inverting (−) input and the output of operational amplifier $A_3$. The output of operational amplifier $A_3$ also connects to the noninverting (+) input of operational amplifier $A_2$. Resistors $R_4$ and $R_5$ fix the gain of operational amplifier $A_3$, and hence, determine the amount of inverted signal fed back to the noninverting (+) input of operational amplifier $A_2$. The amount of the inverted signal fed back in the first loop in conjunction with the amount of signal fed back in the second loop causes the current through the load impedance Z to be independent, as will be shown hereinafter, of any output voltage contribution from the second operational amplifier $A_2$. The second feedback loop which couples a portion of the output of operational amplifier $A_2$ back to the inverting (−) input of operational amplifier $A_1$ is comprised of a resistor $R_6$.

Following the dual subscript notation described previously, wherein the operational amplifier input terminals are referred to as (+) for the noninverting side and (−) for the inverting side with (0) representing an operational amplifier output, the enhanced voltage compliance feature is easily shown. As noted previously, since no current flows into an operational amplifier input a virtual short circuit exists between the inverting (−) input and the noninverting (+) input. Consequently, $$V_{-,2} = V_{+,2} = -V_{0,2} \frac{R_5}{R_4} . \quad (4)$$

In view of the double connection to the summing point at the inverting input of operational amplifier $A_1$, this double connection comprising the coupling of control voltage source $E_s$ through resistor $R_1$ and the output of operational amplifier $A_2$ through resistor $R_6$, the output of operational amplifier $A_1$ is the weighted sum of these two signals. This weighted sum is given by $$V_{0,1} = -V_{0,2} \left( \frac{R_3}{R_6} \right) - E_s \left( \frac{R_3}{R_1} \right) \quad (5)$$

Since no current flows into the inverting (−) input of operational amplifier $A_2$, the current through resistor $R_2$ is approximately equal to the current through the load impedance Z and may be expressed as $$I = \frac{V_{-2} - V_{0,1}}{R_2}. \qquad (6)$$

Substitution of equations (4) and (5) into (6) yields $$I = \left\{ E_s \left( \frac{R_3}{R_1} \right) + V_{0,2} \left( \frac{R_3}{R_6} - \frac{R_5}{R_4} \right) \right\} / R_2. \qquad (7)$$

If the ratio of resistors $R_3$ and $R_6$ is made approximately equal to the ratio of resistors $R_5$ and $R_4$, the contribution of the $V_{0,2}$ term in equation (7) becomes vanishingly small. Consequently, the current supplied to the load impedance Z is the same as that provided by the prior art circuit of FIG. 1 and expressed as equation (2) above.

The voltage compliance $V_c$ across the load impedance Z, however, is enhanced. This result follows since in a general case where operational amplifiers $A_1$ and $A_2$ are operating at their full capability $$V_c = V_{0,1_{max}} + V_{0,2_{max}} - IR_2 \qquad (8)$$

where $V_{0,1max}$ and $V_{0,2max}$ represent the maximum output voltage available from operational amplifiers $A_1$ and $A_2$, respectively. When operational amplifiers $A_1$ and $A_2$ are matched in their current and voltage characteristics, $V_{0,1max}$ is equal to $V_{0,2max}$ and $$V_c = 2V_{0,2max} - IR_2 \qquad (9)$$

Hence, under these conditions and when resistor $R_2$ is sufficiently small so as to minimize the contribution of the $IR_2$ term in equation (9), the voltage compliance across the load impedance Z is enhanced by nearly a factor of two.

As an example to illustrate the enhancement of the voltage compliance assume that operational amplifiers $A_1$ and $A_2$ are each capable of providing a 10 volt 1 ampere output. Further, assume that the value of resistor $R_1$ is equal to the value of resistor $R_3$ and that resistor $R_2$ has a value of 1 ohm. For the circuit shown in FIG. 1, $V_c$ is equal to 10 volts since $V_{0,2}$ is equal to 10 volts and $V_{-,2}$ is held at virtual ground. For the circuit of FIG. 2, substitution of the assumed parameter values into expression (8) shows that the voltage compliance $V_c$ is equal to 19 volts. This represents almost a factor of two enhancement in the voltage compliance across the load impedance Z.

In short, the addition of operational amplifier $A_3$ and its associated gain setting resistors $R_4$ and $R_5$ causes operational amplifier $A_2$ to automatically bias its input off ground making, at any instant of time, nearly double the amount of the amplifier's instantaneous output voltage available across the load impedance Z. Moreover, since operational amplifier $A_3$ merely performs a voltage inversion function it need not have the same current handling capabilities as operational amplifiers $A_1$ and $A_2$. As a result, operational amplifier $A_3$ is advantageously a lower power, less expensive device than operational amplifiers $A_1$ and $A_2$.

The portion of the output from operational amplifier $A_2$ fed back through resistor $R_6$ to operational amplifier $A_1$ changes the output of operational amplifier $A_1$ just enough to compensate for the self biasing of operational amplifier $A_2$ while maintaining a current independent of the load impedance Z when the resistor ratio of $R_3$ to $R_6$ is appropriately matched to the resistor ratio of $R_5$ to $R_4$.

Figure 3:
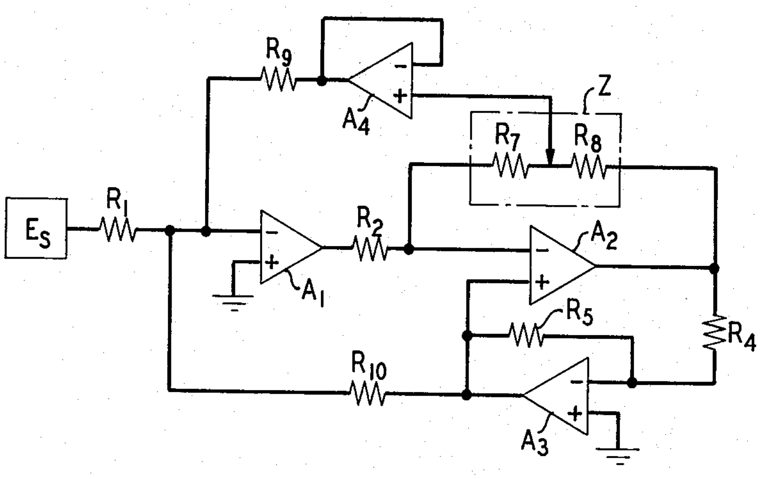
FIG. 3 represents a circuit for providing a controlled voltage in a load impedance while enhancing the voltage compliance across the load.

A relatively simple transformation of the circuitry illustrated in FIG. 2 to that illustrated in FIG. 3 allows the potential at any point in the load impedance Z to be controlled while retaining the voltage enhancement feature. In this case the load impedance Z is represented as two series resistors $R_7$ and $R_8$. A voltage follower comprised of an operational amplifier $A_4$ having its output directly connected to its inverting (−) input is connected at the junction of resistors $R_7$ and $R_8$. (This connection is made in an analogous manner as a reference electrode might be connected in an electrochemical cell. Such a reference electrode would be used in conjunction with the circuitry illustrated in FIG. 2 in order to determine, for example, the potential of the working electrode.) The output of operational amplifier $A_4$ is connected to the inverting (−) input of operational amplifier $A_1$ by a resistor $R_9$.

For the circuit shown in FIG. 3, the potential drop $IR_8$ is to be controlled rather than the current through the load impedance Z. The summing point constraint, that is, the operational amplifier characteristic that no current flows into an amplifier input requires that $$\frac{E_s}{R_1} + \frac{V_{0,4}}{R_9} + \frac{V_{0,3}}{R_{10}} = 0. \qquad (10)$$

The voltage to be controlled may be expressed as $$IR_8 = V_{0,2} - V_{+,4} = V_{0,2} - V_{0,4}. \qquad (11)$$

Also $$V_{0,3} = -\frac{R_5}{R_4} V_{0,2}. \qquad (12)$$

Substituting equation (12), and equation (11) after solving for $V_{0,4}$, into equation (10) and solving for $E_s$ yields $$E_s = \frac{R_1}{R_9}(IR_8) + \left( \frac{R_1 R_5}{R_{10} R_4} - \frac{R_1}{R_9} \right) V_{0,2}. \qquad (13)$$

When resistors $R_1$ and $R_9$ are equal and the product of resistors $R_1$ and $R_5$ is equal to the product of resistors $R_{10}$ and $R_4$, the voltage to be controlled in the load impedance Z is equal to $IR_8$. It should be noted that if the product of resistors $R_9$ and $R_5$ is made equal to the product of resistors $R_{10}$ and $R_4$, this will be sufficient to cancel the $V_{0,2}$ term while leaving only a scaling factor $R_1/R_9$ multiplying the voltage parameter to be controlled. Finally, the maximum voltage available to the total load impedance Z in this case is identical to that of the controlled current configuration illustrated in FIG. 2 and expressed in equation (8).

In all cases it is to be understood that the above described embodiment is illustrative of but a small number of the many possible specific embodiments which can represent applications of the principles of the invention. Thus, numerous and varied other embodiments can readily be devised in accordance with these principles by those skilled in the art without departing from the spirit and scope of the invention.

What is claimed is:

1. Operational amplifier circuitry for maintaining a controlled signal level at a variable, floating load impedance with an enhanced voltage compliance across the load impedance, the circuitry including:

a first operational amplifier having inverting and noninverting inputs and an output, said load impedance having one terminal which is responsive to signal variations from said first operational amplifier output and another terminal which is responsive to signal variations at said inverting input of said first operational amplifier, means for supplying a variable control voltage signal, a second operational amplifier having inverting and noninverting inputs and an output, said noninverting input being maintained at a reference ground potential, a first resistor serially connecting said variable control voltage signal supply means to said second operational amplifier inverting input, means for coupling a portion of said output from said second operational amplifier back to its inverting input, a second resistor serially connecting said second operational amplifier output to said first operational amplifier inverting input, inverting circuitry for coupling an inverted variable signal reference from the output of said first operational amplifier back to its noninverting input, and means for coupling a portion of the output signal from said first operational amplifier back to said second operational amplifier inverting input.

2. The operational amplifier circuitry in accordance with claim 1 wherein the signal level being controlled is an electrical current through said load impedance, said current being held at a constant level regardless of the value said load impedance takes on over a predetermined range of values up to the ratio of the enhanced compliance voltage to the controlled current, and said means for coupling a portion of said second operational amplifier output back to its inverting input comprises a third resistor, the ratio of said third resistor value to the product of said first and second resistor values providing a proportionality constant which, in conjunction with said variable control voltage signal, controls the amount of current delivered to said first operational amplifier inverting input independent of the value said load impedance takes on over said predetermined range of values.

3. The operational amplifier circuitry in accordance with claim 2 wherein the inverting circuitry includes a third operational amplifier having inverting and noninverting inputs and an output, said noninverting input being maintained at a reference ground potential and said output being connected to said first operational amplifier noninverting input, a fourth resistor connecting said output of said first operational amplifier to said inverting input of said third operational amplifier, and a fifth resistor connecting said output of said third operational amplifier to its inverting input.

4. The operational amplifier circuitry in accordance with claim 3 wherein the means for coupling a portion of the output signal from the first operational amplifier back to the control current signal supply means comprises a sixth resistor connected between said output of said first operational amplifier and said inverting input of said second operational amplifier, the ratio of resistor values of said fifth resistor to said fourth resistor being approximately equal to the ratio of resistor values of said third resistor to said sixth resistor to effect enhanced voltage compliance across said load impedance while maintaining said predetermined control current signal through said load impedance.

5. The operational amplifier circuitry in accordance with claim 1 wherein the signal level being controlled is an electrical voltage at any point in said load impedance, and same means for coupling a portion of the output from the second operational amplifier back to its inverting input includes a third resistor, said third resistor comprising a separable portion of said load impedance, a third operational amplifier having an inverting and a noninverting input and an output, said output being directly coupled to said inverting input and said third resistor coupled to said third operational amplifier noninverting input, and a fourth resistor connected between said third operational amplifier output and said second operational amplifier inverting input.

6. The operational amplifier circuitry in accordance with claim 5 wherein the inverting circuitry for coupling the output of the first operational amplifier to its noninverting input includes a fourth operational amplifier having an inverting and a noninverting input and an output, said noninverting input being maintained at a reference ground potential and said output being connected to said first operational amplifier noninverting input, a fifth resistor connecting said output of said first operational amplifier to said inverting input of said fourth operational amplifier, and a sixth resistor connecting said output of said fourth operational amplifier to its inverting input.

7. The operational amplifier circuitry in accordance with claim 5 wherein the means for coupling a portion of the output signal from the first operational amplifier back to the control current signal supply means includes a fourth operational amplifier having an inverting and a noninverting input and an output, said noninverting input being maintained at a reference ground potential and said output being connected to said first operational amplifier noninverting input, a fifth resistor connecting said output of said first operational amplifier to said inverting input of said fourth operational amplifier, a sixth resistor connecting said output of said fourth operational amplifier to its inverting input, and a seventh resistor coupling said output of said fourth operational amplifier to said inverting input of said second operational amplifier, said fourth through said seventh resistors having such values that a product of the resistance values for said fourth and sixth resistors is approximately equal to a product of the resistance values for said fifth and seventh resistors to effect enhanced voltage compliance across said load impedance.

* * * * *